United States Patent
Ota

(10) Patent No.: US 11,296,047 B2
(45) Date of Patent: Apr. 5, 2022

(54) WIRING WITH EXTERNAL TERMINAL

(71) Applicant: Micron Technology, Inc., Boise, ID (US)

(72) Inventor: Ken Ota, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/453,842

(22) Filed: Jun. 26, 2019

(65) Prior Publication Data

US 2019/0319004 A1 Oct. 17, 2019

Related U.S. Application Data

(63) Continuation of application No. 15/910,659, filed on Mar. 2, 2018, now Pat. No. 10,468,371, which is a continuation of application No. 14/936,542, filed on Nov. 9, 2015, now Pat. No. 9,941,238.

(51) Int. Cl.
| | |
|---|---|
| *H01L 23/48* | (2006.01) |
| *H01L 23/00* | (2006.01) |
| *G11C 5/06* | (2006.01) |
| *G11C 7/10* | (2006.01) |
| *H01L 23/50* | (2006.01) |
| *H01L 23/528* | (2006.01) |

(52) U.S. Cl.
CPC .............. *H01L 24/49* (2013.01); *G11C 5/06* (2013.01); *H01L 24/09* (2013.01); *G11C 7/1057* (2013.01); *G11C 7/1084* (2013.01); *G11C 2207/105* (2013.01); *H01L 23/50* (2013.01); *H01L 23/528* (2013.01); *H01L 2224/4909* (2013.01)

(58) Field of Classification Search
None
See application file for complete search history.

(56) References Cited

U.S. PATENT DOCUMENTS

| | | | | |
|---|---|---|---|---|
| 5,684,440 | A  * | 11/1997 | Yabuki | H01P 1/20381 333/204 |
| 6,151,257 | A | 11/2000 | Jeffrey | |
| 7,023,742 | B2 | 4/2006 | Choi | |
| 9,941,238 | B2 * | 4/2018 | Ota | H01L 24/49 |
| 2007/0035688 | A1 | 2/2007 | Matsuura | |
| 2007/0253267 | A1 * | 11/2007 | Nobutoki | G11C 5/063 365/207 |
| 2017/0133385 | A1 | 5/2017 | Ota | |
| 2018/0190613 | A1 | 7/2018 | Ota | |

* cited by examiner

*Primary Examiner* — Hung K Vu
(74) *Attorney, Agent, or Firm* — Dorsey & Whitney LLP

(57) ABSTRACT

Apparatuses for providing external terminals of a semiconductor device are described. An example apparatus includes: a connection wiring of a ring-shape having comprising a hole and a conductive layer surrounding the hole, the conductive layer including a first connection point and a second connection point that are located so that a straight line between the first connection point and the second connection point crosses over the hole; an external terminal coupled to the first connection point of the conductive layer of the connection wiring; and an internal circuit coupled to the second connection point of the conductive layer of the connection wiring.

19 Claims, 8 Drawing Sheets

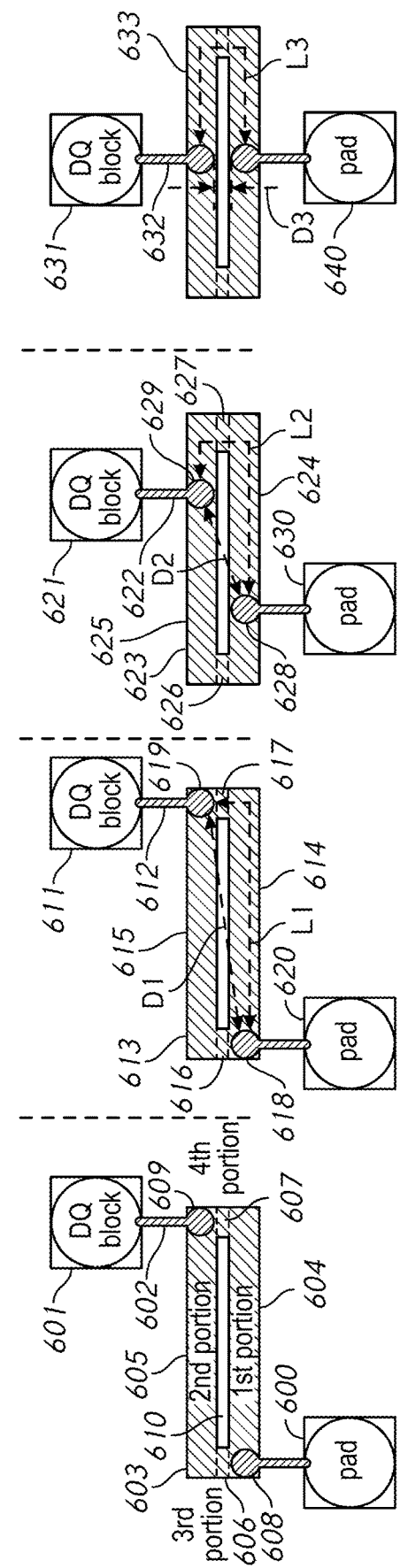

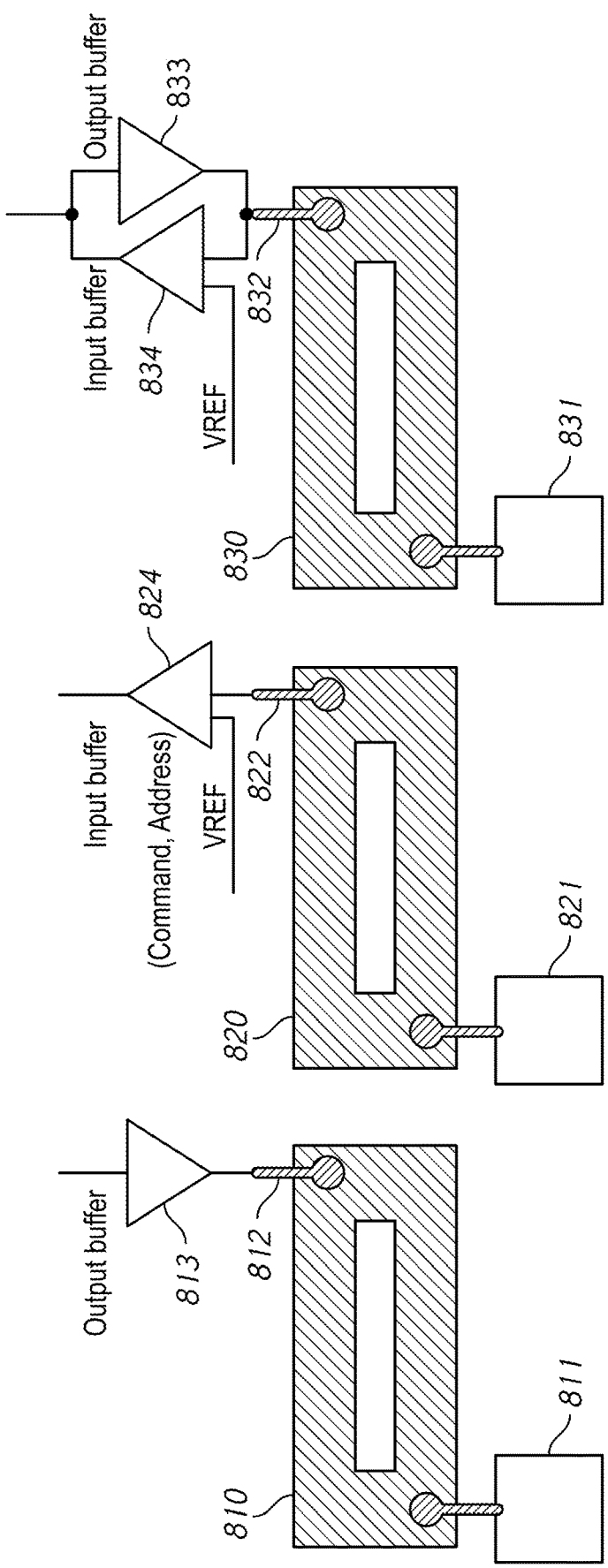

WIRING WITH EXTERNAL TERMINAL

CROSS-REFERENCE TO RELATED APPLICATION(S)

This application is a continuation of U.S. patent application Ser. No. 15/910,659 filed Mar. 2, 2018 and issued as U.S. Pat. No. 10,468,371 on Nov. 5, 2019, which is a continuation of U.S. patent application Ser. No. 14/936,542, filed Nov. 9, 2015 and issued as U.S. Pat. No. 9,941,238 on Apr. 10, 2018. The aforementioned applications, and issued patents, are incorporated herein by reference, in their entirety, for any purpose.

BACKGROUND

High data reliability, high speed of memory access, and reduced chip size are features that are demanded from semiconductor memory.

In recent years, there has been an effort to reduce an area of a peripheral circuit region that is occupied by peripheral circuitry included on a semiconductor die of a memory device. For example, U.S. Pat. No. 6,151,257 describes an electronic circuit die including a plurality of first and second input/output pad buffer cells, where one of the first input/output buffer cells includes at least a latch for latching data signals and one of the second input/output pad buffer cells includes a pad that receives clock signal which are supplied to the latches of the first I/O pad buffer cells. As a result of this design, the conductive traces between the latches and the core logic need not be precisely matched, thus reducing cost. Another example is U.S. Pat. No. 7,023,742, which describes a semiconductor device and a method for inputting and outputting data simultaneously through a single pad. The semiconductor device includes an output buffer and an input buffer, and further includes first and second switching circuits. Another example is U.S. patent application publication 2007/0253267 A1, that describes a semiconductor device including a shared sense amplifier portion that has a driver transistor implemented by a ring-shaped gate electrode. Thus, the shared sense amplifier portion can be effective in the chip size reduction while an unbalance due to Kink effect can be reduced.

BRIEF DESCRIPTION OF THE DRAWINGS

FIGS. 6A-6D are schematic diagrams of variations of wirings with external terminals according to the present disclosure.

FIGS. 8A-8C are circuit diagrams of variations of wirings with external terminals according to the present disclosure.

DETAILED DESCRIPTION OF PREFERRED EMBODIMENTS

Figure 1:
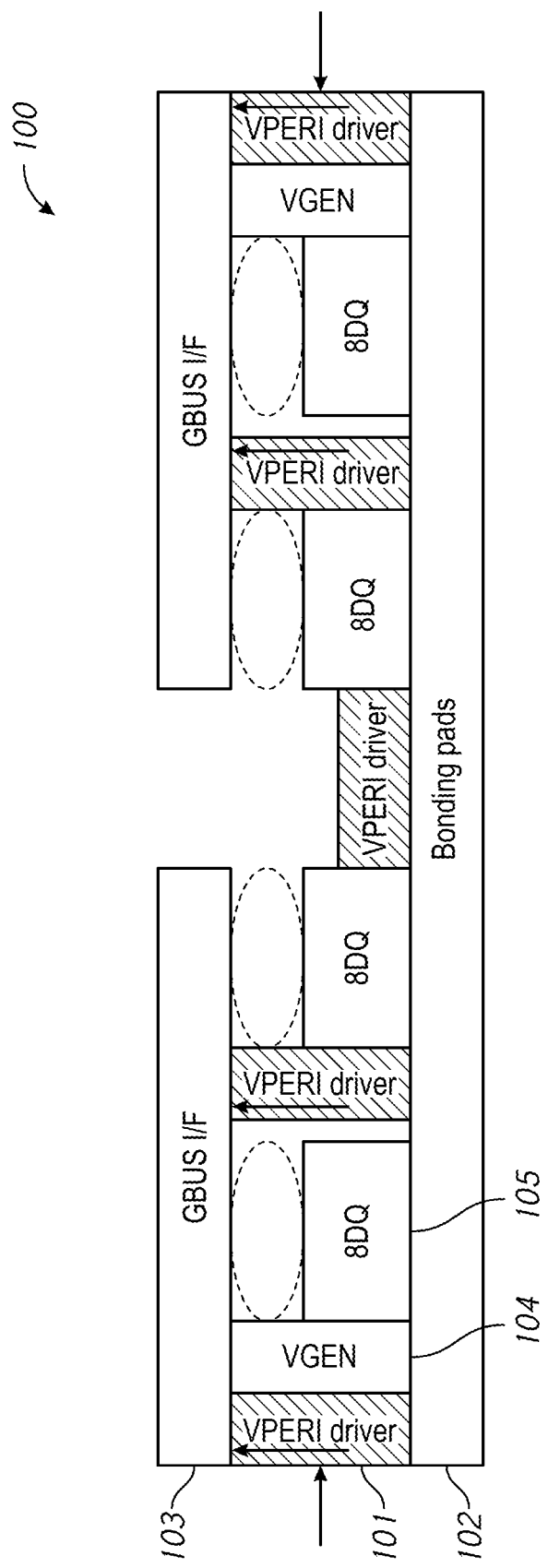
FIG. 1 is a schematic diagram of circuits around external terminals.
Figure 2:
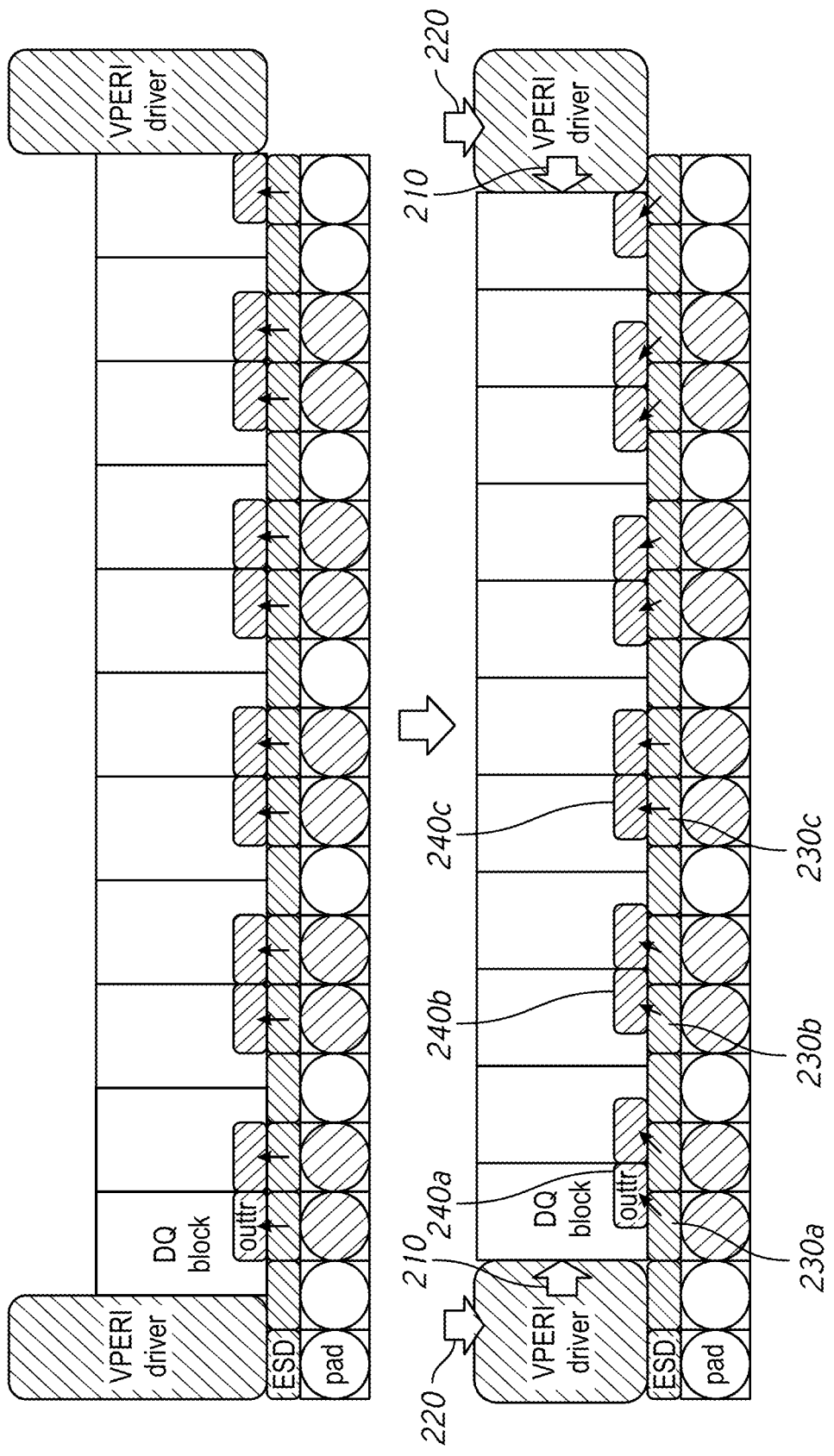
FIG. 2 is a schematic diagram of circuits around external terminals according to the present disclosure.
Figure 3:
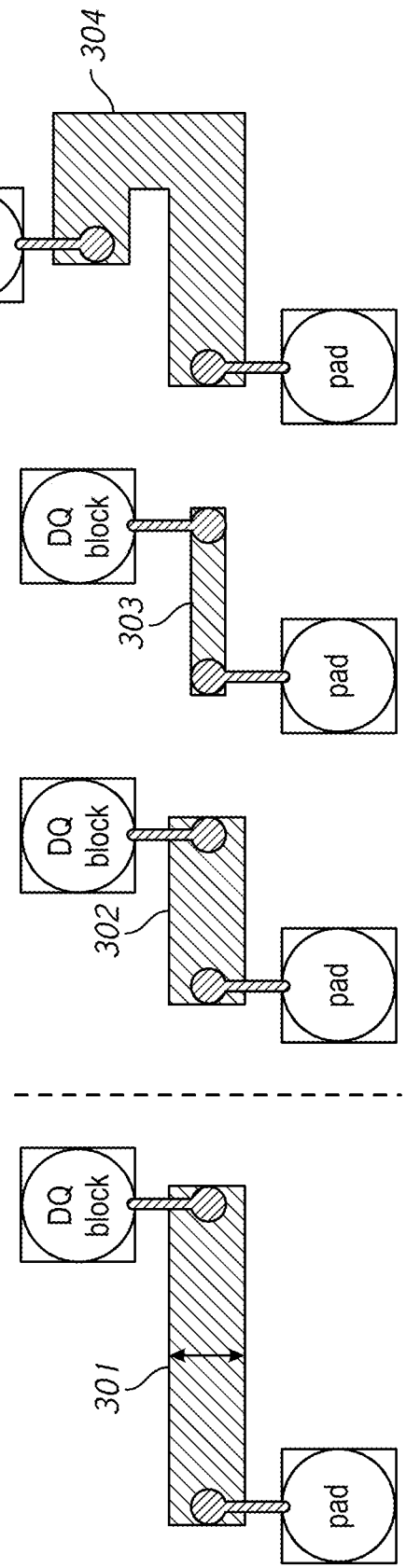
FIG. 3 is a schematic diagram showing variations of wirings with external terminals.

High data reliability, high speed of memory access, and reduced chip size are features that are demanded from semiconductor memory. Reducing an area of a peripheral circuit region may be effective in reducing the chip size. FIG. 1 shows an example of area reduction of a peripheral circuit region 100. As shown in FIG. 1, the area reduction of the peripheral circuit region 100 may result in a larger height of a voltage driver for an internal voltage (VPERI) 101. The larger height of the VPERI driver 101 on bonding pads 102 of the peripheral circuit region 100 may consequently cause gaps between read/write bus interfaces (GBUS I/Fs) 103 and inputs/outputs (DQs) 105 while having external power supply voltage generators (VGENs) 104 aligned with the VPERI driver 101. In order to prevent such gaps, it is possible to shift the position of circuits including the inputs/outputs (DQs) 105 and the external power supply voltage generators (VGENs) 104 relative to the pads. FIG. 2 is a schematic diagram of circuits around external terminals including such shifted pads according to the present disclosure. The upper schematic diagram of FIG. 2 shows the increased height of the VPERI drivers. By shifting the circuits, the areas for VPERI drivers are increased and an increase in the height of VPERI drivers may not be required. The increased area for the VPERI drivers is shown in FIG. 2 as arrows 210, and the unnecessary increase in height is shown as arrows 220. However, shifting the circuits may cause different shapes of circuitry components, such as wiring, that couples a DQ block to a respective pad as shown in the lower schematic diagram of FIG. 2. For example, a first output buffer (outtr) 240a is arranged diagonal to a first electrostatic discharge protection (ESD) circuit 230a. A second output buffer 240b is slightly shifted from a second ESD circuit 230b. A third output buffer 240c and a third ESD circuit 230c are aligned. Thus, an actual distance between an output buffer and a respective ESD circuit may be different across combinations of the output buffer and the respective ESD circuit. FIG. 3 shows schematic diagrams of variations of an apparatus including a connection wiring coupling an external terminal (e.g., "pad") to a circuitry node of a DQ block. A wiring should be designed in a manner that the wiring is durable against mean-time to failure (MTTF). For example, the size of the wiring may be based, at least in part, on an amount of current to flow between the DQ block and the pad. A second wiring 302 is one variation based on a first wiring 301. The second wiring 302 has a lower resistance compared with a resistance of the first wiring 301 because of the shorter distance between the pad and the DQ block. In order to keep the same resistance in comparison to the first wiring 301, other dimensions of the wiring may be reduced in addition to having a shorter distance, as shown for a third wiring 303. As shown by the third wiring 303, a width of the wiring may be reduced. However, these reduced dimensions may result in a wiring that does not meet required durability against the MTTF. Another wiring variation between the pad and the DQ block which may have the same resistance as the first wiring 301 and meet required durability against the MTTF is shown with reference to a fourth wiring 304. However, the fourth wiring 304 results in more wiring area, which is undesirable. Thus it may be difficult to design wiring for different distances between the DQ block and the pad that have similar parasitic resistance and capacitance (to provide similar propagation delay characteristics) while satisfying the MTTF for durability.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 4:
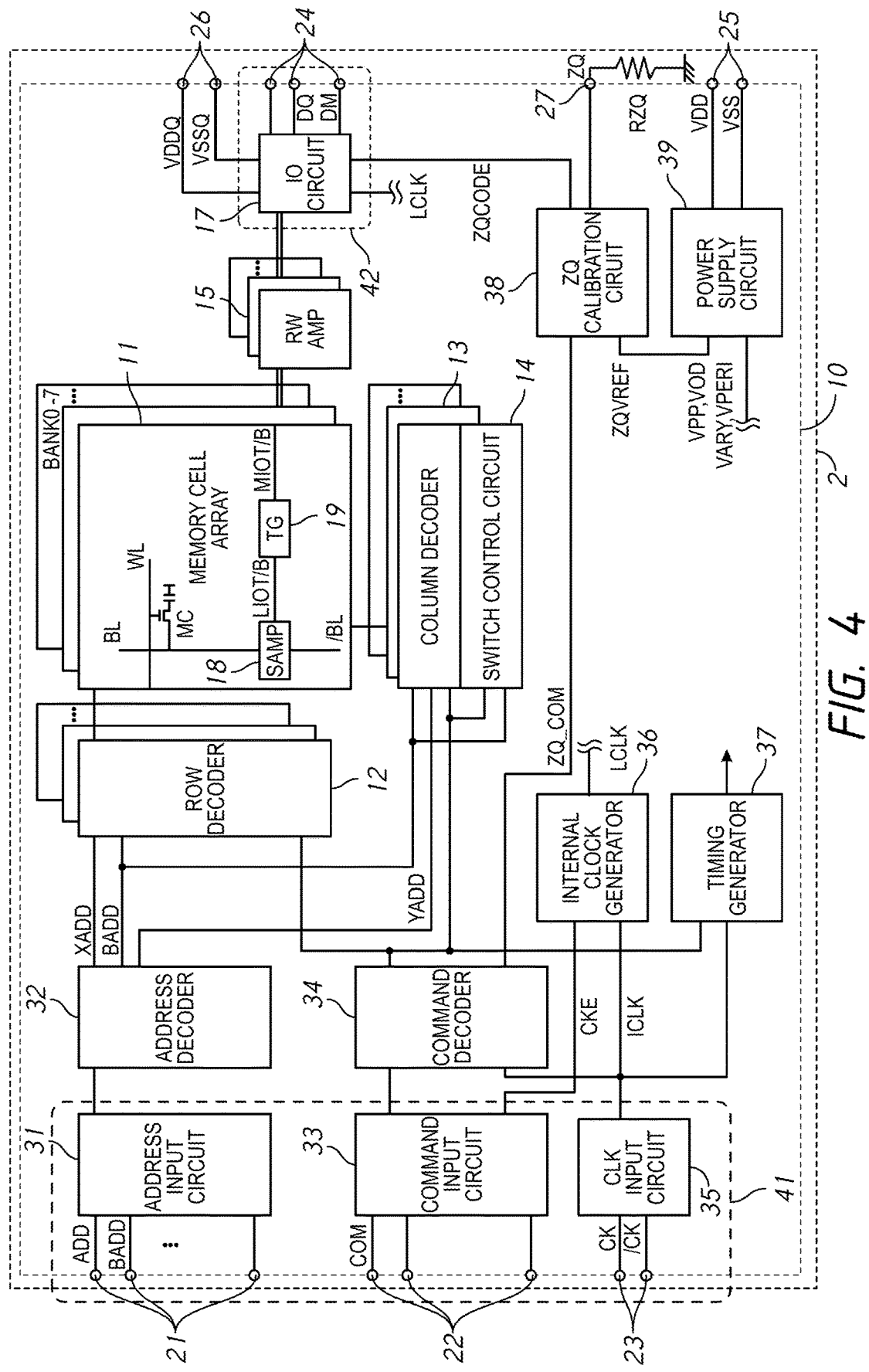
FIG. 4 is a block diagram of a semiconductor device in accordance with the present disclosure.

FIG. 4 is a block diagram of a semiconductor device in accordance with one embodiment of the present disclosure. The semiconductor device 10 may be a DDR4 SDRAM integrated into a single semiconductor chip, for example. The semiconductor device 10 may be mounted on an external substrate 2 that is a memory module substrate, a mother board or the like. The external substrate 2 employs an external resistor $R_{ZQ}$ that is connected to a calibration terminal ZQ 27 of the semiconductor device 10. The external resistor $R_{ZQ}$ is a reference impedance of a ZQ calibration circuit 38. In the present embodiment, the external resistor $R_{ZQ}$ is coupled to a ground potential.

As shown in FIG. 4, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local I/O line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, clock terminals 23, data terminals 24, power supply terminals 25 and 26, and the calibration terminal ZQ 27. An input signal block 41 may include the address terminals 21, the command terminals 22 and the clock terminals 23 may include input buffers that will be later described, according to one embodiment. A data interface block 42 includes the data terminals 24. The data terminals 24 may be coupled to output buffers for read operations of memories. Alternatively, the data terminals 24 may be coupled to input buffers for read/write access of the memories. FIG. 4 shows an example of dynamic random access memory (DRAM), however, any device having external terminals for signal input/output may be included as the external terminals of embodiments of the present disclosure.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12, the column decoder 13, and a switch control circuit 14.

The command terminals 22 are supplied with a command signal COM. The command signal COM may include one or more separate signals. The command signal COM input to the command terminals 21 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line, and a calibration signal ZQC provided to the ZQ calibration circuit 38.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output circuit 17. Similarly, when the write command is issued and a row address and a column address are timely supplied with this command, and then write data DQ is supplied to the data terminals 24, the write data DQ is supplied via the input/output circuit 17 and the read/write amplifier 15 to the memory cell array 11 and written in the memory cell MC designated by the row address and the column address.

The clock terminals 23 are supplied with external clock signals CK and /CK, respectively. These external clock signals CK and /CK are complementary to each other and are supplied to a clock input circuit 35. The clock input circuit 35 receives the external clock signals CK and /CK and generates an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 17 and is used as a timing signal for determining an output timing of the read data DQ. The internal clock signal ICLK is also supplied to a timing generator 37 and thus various internal clock signals can be generated.

The power supply terminals 25 are supplied with power supply potentials VDD and VSS. These power supply potentials VDD and VSS are supplied to an internal power supply circuit 39. The internal power supply circuit 39 generates various internal potentials VPP, VOD, VARY, VPERI, and the like and a reference potential ZQVREF based on the power supply potentials VDD and VSS. The internal potential VPP is mainly used in the row decoder 12, the internal potentials VOD and VARY are mainly used in the sense amplifiers 18 included in the memory cell array 11, and the internal potential VPERI is used in many other circuit blocks. The reference potential ZQVREF is used in the ZQ calibration circuit 38.

The power supply terminals 26 are supplied with power supply potentials VDDQ and VSSQ. These power supply potentials VDDQ and VSSQ are supplied to the input/output circuit 17. The power supply potentials VDDQ and VSSQ may be the same potentials as the power supply potentials VDD and VSS that are supplied to the power supply terminals 25, respectively. However, the dedicated power supply potentials VDDQ and VSSQ may be used for the input/output circuit 17 so that power supply noise generated by the input/output circuit 17 does not propagate to the other circuit blocks.

The calibration terminal ZQ is connected to the calibration circuit 38. The calibration circuit 38 performs a calibration operation with reference to an impedance of an external resistance Re and the reference potential ZQVREF, when activated by the calibration signal ZQ_COM. An impedance code ZQCODE obtained by the calibration operation is supplied to the input/output circuit 17, and thus an impedance of an output buffer (not shown) included in the input/output circuit 17 is specified.

Figure 5:
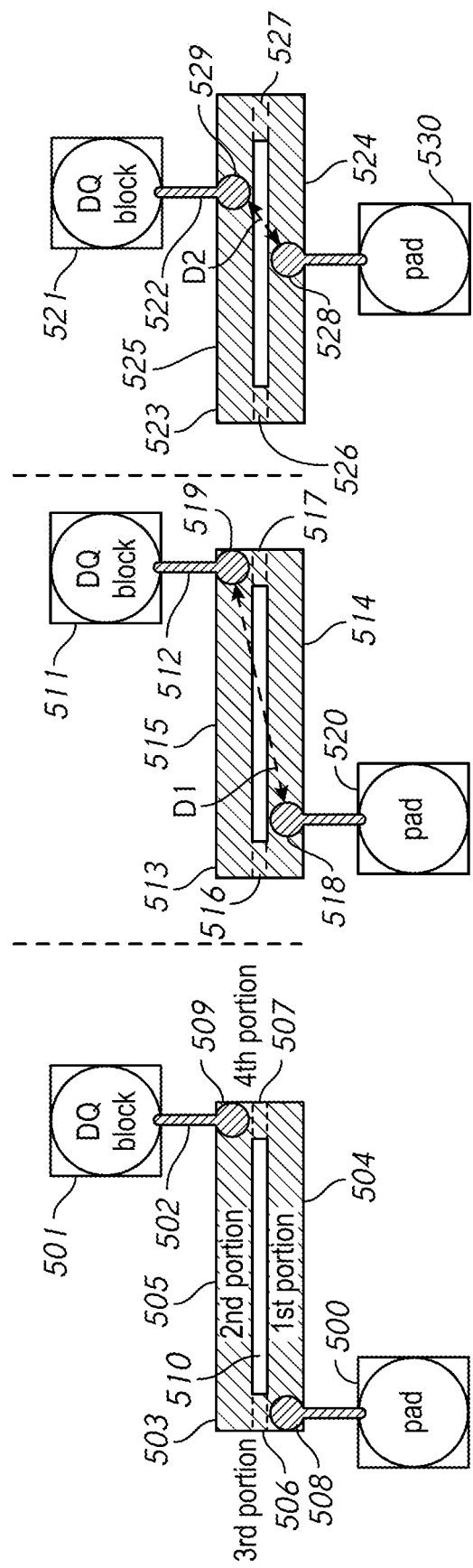
FIG. 5 is a schematic diagram showing variations of wirings with external terminals according to the present disclosure.

FIG. 5 shows schematic diagrams of variations of an apparatus including external terminals according to the present disclosure. As will be described in more detail below, with reference to a first connection wiring, shown on the left of FIG. 5, a semiconductor apparatus according to the present disclosure may include an external terminal 500, a circuit node 502 and a connection wiring 503 having a portion in a ring shape and coupling the external terminal 500 to the circuit node 502. The external terminal 500 may be a DQ pad. A DQ block 501 may be coupled to the circuit node 502. The ring shaped portion of the connection wiring 503 has a conductive layer surrounding a hole 510. The ring shaped portion of the connection wiring 503 includes a first portion 504 and a second portion 505. The conductive layer of the ring shaped portion of the connection wiring 503 includes a first connection point 508 and a second connection point 509. The first portion 504 is coupled to the external terminal 500 at the first connection point 508 and the second portion 505 is coupled to the circuit node 502 at the second connection point 509. The ring shaped portion of the connection wiring 503 further includes a third portion 506 which couples the first portion 504 and the second portion 505 at a first end (e.g., left in FIG. 5) of the connection wiring 503 and a fourth portion 507 which couples the first portion 504 and the second portion 505 at a second end (e.g., right in FIG. 5) of the connection wiring 503. The first connection point 508 can be located anywhere along the first portion 504 and the second connection point 509 can be located anywhere along the second portion 505. Generally, the first connection point 508 and the second connection point 509 can be located across the hole 510 from each other. However, the locations of the first and second connection points 508 and 509 are not limited to being located across the hole 510 from each other. A straight line segment defined by the first connection point 508 and the second connection point 509 can be across the hole 510. In one example, the first connection point 508 may be located at the first end of the first portion 504 and the second connection point 509 may be located at the second end of the second portion 505.

In another example, with reference to a second connection wiring shown at the middle of FIG. 5, a semiconductor apparatus according to the present disclosure may include an external terminal 520, a circuit node 512 and a connection wiring 513 having a portion in a ring shape and coupling the external terminal 520 to the circuit node 512. The external terminal 520 may be a DQ pad. A DQ block 511 may be coupled to the circuit node 512. Similar to the ring-shaped portion of the connection wiring 503, a ring shaped portion of the connection wiring 513 includes a first portion 514 and a second portion 515, a third portion 516 which couples the first portion 514 and the second portion 515 at a first end (e.g., left in FIG. 5) of the connection wiring 513, a fourth portion 517 which couples the first portion 514 and the second portion 515 at a second end (e.g., right in FIG. 5) of the connection wiring 513, a first connection point 518 and a second connection point 519. In this example, the first connection point 518 may be located between a center and at the first end of the first portion 504 and the second connection point 509 may be located at the second end of the second portion 505.

With reference to a third connection wiring shown at the right of FIG. 5, the apparatus may further include an additional external terminal 530, an additional circuit node 522 and an additional connection wiring 523 having a portion in a ring shape and coupling the additional external terminal 530 to the additional circuit node 522. Similar to the ring-shaped portion of the connection wiring 503, a ring shaped portion of the connection wiring 523 includes a fifth portion 524 and a sixth portion 525, a seventh portion 526 which couples the fifth portion 524 and the sixth portion 525 at a third end (e.g., left in FIG. 5) of the connection wiring 523, an eighth portion 527 which couples the fifth portion 524 and the sixth portion 525 at a fourth end (e.g., right in FIG. 5) of the connection wiring 523, a third connection point 528 and a fourth connection point 529. The third connection point 528 may be located at a center of the fifth portion 524 which is between the first end and the second end of the fifth portion 524. The fourth connection point 529 may be located between a center and at the second end of the sixth portion 525.

The ring-shaped portion in the connection wiring 513 and the ring-shaped portion in the additional connection wiring 523 are designed in a manner that the connection wiring and the additional connection wiring may provide substantially the same shape regardless location relationship between the external terminal and the circuit node. For example, the ring-shaped portion of the connection wiring 513 and the ring-shaped portion of the additional connection wiring 523 may have the same rectangular shape. Further, a first actual distance D1 between the first connection point 518 and the second connection point 519, such as the external terminal 520 and the circuit node 512, and a second actual distance D2 between the third connection point 528 and the fourth connection point 529, such as the additional external terminal 530 and the additional circuit node 522, may be different. However, a shape of connection wirings having a portion in a ring shape between an external terminal and an additional circuit node are the same. Thus, the ring-shaped portion in the connection wiring may provide a simple design using a plurality of connection wirings while allowing external terminals (e.g., pads) and corresponding circuits (e.g., DQ blocks) to be shifted relative to one another. The connection wiring may be used to facilitate reducing the area of the peripheral circuit region.

As shown in FIG. 5, a shape of the "ring-shaped" portion in this disclosure can be rectangular, and is not limited to an annulus shape. For example, the ring-shaped portion of the connection wiring 503 may have an oblong shape (e.g., rectangular, rounded rectangular, oval, ellipse, etc.) or any shape which includes a hole and a ring-shaped portion. Similarly, it is possible that any pair of connection wirings having the same impedance can have the similar effect as long as having the same partial impedance. Any arrangement of connection wirings having holes coupling an external terminal and a circuit node having substantially the same impedance between an external terminal and a circuit node can be an embodiment of the present disclosure.

FIG. 6A-6D are schematic diagrams of variations of an apparatus including external terminals according to one embodiment of the present disclosure. As will be described in more detail below, with reference to a first connection wiring, shown on FIG. 6A, a semiconductor apparatus according to the present disclosure may include an external terminal 600, a circuit node 602 and a connection wiring 603 having a portion in a ring shape and coupling the external terminal 600 to the circuit node 602. The external terminal 600 may be a DQ pad. A DQ block 601 may be coupled to the circuit node 602. The ring shaped portion of the connection wiring 603 has a conductive layer surrounding a hole 610. The ring shaped portion of the connection wiring 603 includes a first portion 604 and a second portion 605. The conductive layer of the ring shaped portion of the connection wiring 603 includes a first connection point 608 and a second connection point 609. The first portion 604 is coupled to the external terminal 600 at the first connection point 608 and the second portion 605 is coupled to the circuit node 602 at the second connection point 609. The ring shaped portion of the connection wiring 603 further includes a third portion 606 which couples the first portion 604 and the second portion 605 at a first end (e.g., left in FIG. 6A) of the connection wiring 603 and a fourth portion 607 which couples the first portion 604 and the second portion 605 at a second end (e.g., right in FIG. 6A) of the connection wiring 603. The first connection point 608 can be located anywhere along the first portion 604 and the second connection point 609 can be located anywhere along the second portion 605. Generally, the first connection point 608 and the second connection point 609 can be located across the hole 610 from each other. However, the locations of the first and second connection points 608 and 609 are not limited to being located across the hole 610 from each other. A straight line segment defined by the first connection point 608 and the second connection point 609 can be across the hole 610.

In one example, the first connection point 608 and the second connection point 609 may have a distance around of the "ring-shaped" portion of the connection wiring 603 in a manner that an impedance between the first connection point 608 and the second connection point 609 can be controlled regardless of an actual distance represented by the length of the straight line segment between the first connection point 608 and the second connection point 609. These types of formations of the first connection point 608 and the second connection point 609 with regards to the ring-shaped portion of the connection wiring 603 may provide an impedance between the circuit node 602 and the external terminal 600 substantially the same regardless of an actual distance between the circuit node 602 and the external terminal 600. Substantially the same as used herein is not intended to mean that the impedances are exactly the same. Substantially the same is intended to include a range of impedances. In some embodiments, the range of impedances may be within a quarter of the sheet resistance, as will be described in more detail below. For example, with reference to a second connection wiring shown at the middle of FIG. 6B, a semiconductor apparatus according to the present disclosure may include an external terminal 620, a circuit node 612 and a connection wiring 613 having a portion in a ring shape and coupling the external terminal 620 to the circuit node 612. The external terminal 620 may be a DQ pad. A DQ block 611 may be coupled to the circuit node 612. Similar to the ring-shaped portion of the connection wiring 603, a ring shaped portion of the connection wiring 613 includes a first portion 614 and a second portion 615, a third portion 616 which couples the first portion 614 and the second portion 615 at a first end (e.g., left in FIG. 6B) of the connection wiring 613, a fourth portion 617 which couples the first portion 614 and the second portion 615 at a second end (e.g., right in FIG. 6B) of the connection wiring 613, a first connection point 618 and a second connection point 619. With reference to a third connection wiring shown at the right of FIG. 6, the apparatus may further include an additional external terminal 630, an additional circuit node 622 and an additional connection wiring 623 having a portion in a ring shape and coupling the additional external terminal 630 to the additional circuit node 622. Similar to the ring-shaped portion of the connection wiring 603, a ring shaped portion of the connection wiring 623 includes a fifth portion 624 and a sixth portion 625, a seventh portion 626 which couples the fifth portion 624 and the sixth portion 625 at a third end (e.g., left in FIG. 6C) of the connection wiring 623, an eighth portion 627 which couples the fifth portion 624 and the sixth portion 625 at a fourth end (e.g., right in FIG. 6C) of the connection wiring 623, a third connection point 628 and a fourth connection point 629. The ring-shaped portion in the connection wiring 613 and the ring-shaped portion in the additional connection wiring 623 are designed in a manner that the connection wiring and the additional connection wiring may provide the same parasitic resistance for the connection wiring coupling the external terminal to the circuit node regardless variations in an actual distance between the external terminal and the circuit node. For example, the ring-shaped portion of the connection wiring 613 and the ring-shaped portion of the additional connection wiring 623 may have the same rectangular shape. Further, a first actual distance D1 between the first connection point 618 and the second connection point 619, such as the external terminal 620 and the circuit node 612, and a second actual distance D2 between the third connection point 628 and the fourth connection point 629, such as the additional external terminal 630 and the additional circuit node 622, may be different. However, a first impedance distance L1 around a portion in a ring shape between the external terminal 620 and the circuit node 612 and a second impedance distance L2 around a portion in a ring shape between the additional external terminal 630 and the additional circuit node 622 are the same. When a shape and material of the second and third connection wirings are substantially the same, the first impedance distance L1 may determine a first partial impedance between the first connection point and the second connection point via the fourth portion and the second impedance distance L2 may determine a second partial impedance between the third connection point and the fourth connection point via the eighth portion. Thus, the first partial impedance and the second partial impedance are the same.

As a result, the second impedance distance L2 based on resistance and conductance from the additional external terminal 630 to the additional circuit node 622 is substantially the same as the first impedance distance L1 from the external terminal 620 to the circuit node 612, while the second actual distance D2 between the additional external terminal 630 and the additional circuit node 622 is different from the first actual distance D1 between the external terminal 620 and the circuit node 612. Similarly, a third impedance distance L3 in FIG. 6D based on resistance and conductance from another external terminal 640 to another circuit node 632 is substantially the same as the first impedance distance L1, while a third actual distance D3 between the another external terminal 640 and the another circuit node 632 is different from the first actual distance D1.

Regarding a delay between a circuit node and an external terminal, the embodiments shown in FIGS. 6A-6D represent substantially accurate alignment of delays as compared with the embodiments shown at the right and the middle of FIG. 5 which may represent misalignment of delays. Please note that the embodiments in FIG. 5 can still effectively suppress an amount of misalignment of delays as compared with variations shown in FIG. 3. For example, while a shift of a position of a connection point on a connection wiring may decrease a delay by approximately 30% in FIG. 3, the same amount of position shift of the connection point on a ring-shaped connection wiring may decrease a delay by approximately 10% in FIG. 5. Similarly, while the position shift of the connection point of the connection wiring may increase the delay by approximately 30% in FIG. 3, the same amount of position shift of the connection wiring in FIG. 5 may decrease the delay by approximately 10%. Thus, the ring-shaped connection wiring is effective in reducing variation of the delay due to the position shift of the connection point on the connection wiring.

Thus, the ring-shaped portion in the connection wiring may provide the same delay between the circuit node and the external terminal while allowing external terminals (e.g., pads) and corresponding circuits (e.g., DQ blocks) to be shifted relative to one another. The connection wiring may be used to facilitate reducing the area of the peripheral circuit region. While the actual distance can be varied (e.g. D1, D2, D3, etc.), an impedance distance L1, L2 and L3 between external terminals and respective circuit nodes is constant. As a result, the connection wirings of FIGS. 6B-6D may provide substantially the same impedance distance L1, L2 and L3 based on resistance and conductance between each external terminal to each circuit node, while obtaining various actual distances D1, D2 and D3 between each external terminal and its corresponding circuit node. Thus, the ring-shaped portion in the connection wiring may provide substantially the same delay between the circuit node and the external terminal while reducing the area of the peripheral circuit region.

Figure 7B:
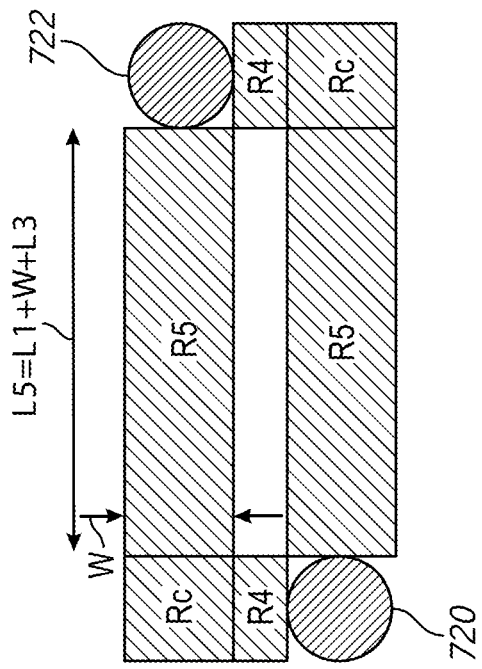
FIGS. 7A and 7B are schematic diagrams of wirings with an external terminal according to the present disclosure.
Figure 7A:
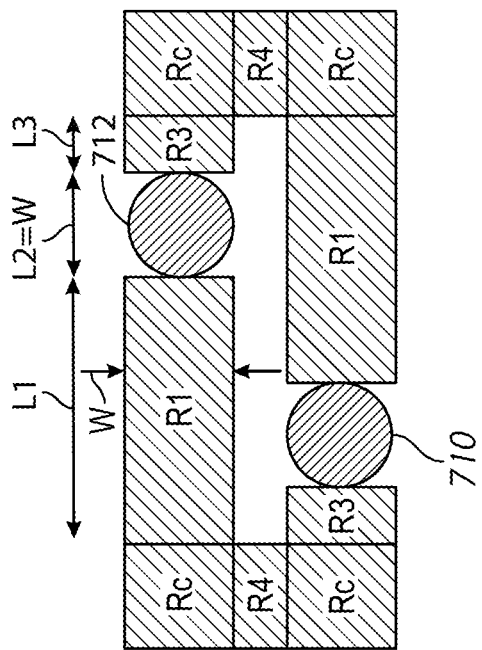

FIGS. 7A and 7B are schematic diagrams of wirings with an external terminal according to the present disclosure. In FIGS. 7A and 7B, ring-shaped wirings are made of material having a sheet resistance ρs. The ring-shaped wirings in FIGS. 7A and 7B have a width W, which may be about the same as a radius L2 of connection points at 710, 712, 720 and 722. $R_1$ is a resistance of first portions having a length L1. $R_3$ is a resistance of third portions having a length L3. $R_4$ is a resistance of fourth portions having a length L4. $R_5$ is a resistance of fifth portions having a length L5 which is a sum of L1, L2 and L3. $R_c$ is a resistance of each corner portion of a rectangular ring shaped connection wiring.

In FIG. 7A, an electrical resistance $R_A$ between a first connection point 710 and a second connection point 712 is the sum of $R_1$, $R_3$, $R_4$ and two $R_c$s. The resistances $R_1$, $R_3$, $R_4$ and $R_c$ and the sum $R_A$ are presented as follows:

$$R_1 = \frac{L_1}{W}\rho s \quad (1)$$

$$R_3 = \frac{L_3}{W}\rho s \quad (2)$$

$$R_4 = \frac{L_4}{W}\rho s \quad (3)$$

$$R_c = 0.5\rho s \quad (4)$$

$$R_A = 0.5(R_1 + R_3 + R_4 + 2R_c) = 0.5\left(\frac{L_1 + L_3 + L_4}{W} + 1\right)\rho s \quad (5)$$

In FIG. 7B, an electrical resistance $R_B$ between a first connection point 720 and a second connection point 722 is the sum of $R_4$, $R_5$ and $R_c$. The resistances $R_4$, $R_5$ and $R_c$ and the sum $R_B$ may be presented as follows:

$$R_5 = \frac{L_1 + W + L_3}{W}\rho s \quad (6)$$

$$R_4 = \frac{L_4}{W}\rho s \quad (7)$$

$$R_c = 0.5\rho s \quad (8)$$

$$R_B = 0.5(R_5 + R_4 + R_c) = \quad (9)$$
$$0.5\left(\frac{L_1 + W + L_3 + L_4}{W} + 0.5\right)\rho s = 0.5\left(\frac{L_1 + L_3 + L_4}{W} + 1.5\right)\rho s$$

The difference in resistance between $R_A$ and $R_B$ are presented as follows:

$$\Delta R = R_B - R_A = \quad (10)$$
$$0.5\left(\frac{L_1 + L_3 + L_4}{W} + 1.5\right)\rho s - 0.5\left(\frac{L_1 + L_3 + L_4}{W} + 1\right)\rho s = 0.25\rho s$$

Thus, a difference in resistance between the electrical resistance $R_A$ of the ring-shaped wiring in FIG. 7A and the electrical resistance $R_B$ of the ring-shaped wiring in FIG. 7B, shown from the above calculation, is about a quarter of the sheet resistance. This difference in resistance is due to having connection points at the corners versus having the connection points off the corners.

FIGS. 8A-8C are circuit diagrams of variations of wirings with external terminals according to the present disclosure.

FIG. 8A shows an output buffer 813 coupled to an external terminal 811 using a ring-shaped connection wiring 810 according to one embodiment. The ring-shaped connection wiring 810 is coupled to the external terminal 811 and further coupled to a circuit node 812. The circuit node 812 is also coupled to an output node of the output buffer 813. The variations of connection wirings 613, 623 and 633 previously described with reference to FIGS. 6A-6C may be applied to the coupling between the output buffer 813 and the external terminal 811 through the ring-shaped connection wiring 810 for matching output impedance. Thus, the connection wiring may provide impedance between the output buffer 813 and the external terminal 811, having substantially the same impedance value regardless of positional relationship and actual distance between the external terminal 811 and the output buffer 813.

FIG. 8B shows an input buffer 824 coupled to an external terminal 821 using a ring-shaped connection wiring 820, according to one embodiment. The ring-shaped connection wiring 820 is coupled to the external terminal 821 and further coupled to a circuit node 822, according to one embodiment. FIG. 8B also shows an input buffer 824 having two input nodes, a first input node supplied with a reference voltage and a second input node coupled to the circuit node 822. The ring-shaped connection wirings as shown in FIG. 8B may be provided at the input signal block 41 of FIG. 4. With reference to FIG. 4, a first set of ring-shaped connection wirings may couple the address terminals 21 to the address input circuit 31. A second set of ring-shaped connection wirings may couple the command terminals 22 to the command input circuit 33. A third set of ring-shaped wirings may couple the clock terminals 23 to the clock input circuit 35. Thus, ring-shaped connection wirings in the input signal block 41 may provide substantially the same input impedance between input terminals in the input signal block 41 and their respective input buffers in input circuits in the input signal block 41, regardless of positional relationship and actual distance between the input terminals and the input buffers.

FIG. 8C shows an output buffer 833 and an input buffer 834 coupled to an external terminal 831 using a ring-shaped connection wiring 830, according to one embodiment. The embodiment may be used where the data terminals 24 are coupled to the input/output circuit 17 in FIG. 1 as previously described. The ring-shaped connection wiring 830 is coupled to an external terminal 831 and further coupled to one end of a circuit node 832. The other end of the circuit node 832 is coupled to an output node of the output buffer 833 and a first input node of the input buffer 834. The input buffer 834 may further include a second input node supplied with a reference voltage. Thus, the connection wiring 830 may provide output/input impedance between the external terminal 830 and either the output buffer 833 or the input buffer 834, having substantially the impedance value regardless of positional relationship and actual distance between the external terminal 811 and the output buffer 833/input buffer 834.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
    an external terminal;
    a circuit node; and
    a connection wiring comprising:
        a first portion connected directly to the external terminal at a first connection point;
        a second portion coupled to the circuit node at a second connection point;
        third portion configured to couple the first portion and the second portion at a first end of the connection wiring; a fourth portion configured to couple the first portion and the second portion at a second end of the connection wiring, and
        a hole surrounded by the first, second, third, and fourth portions, the hole including first, second, third and fourth sides formed by the first, second, third and fourth portions respectively, wherein the first side is longer than the third side.

2. The apparatus of claim 1, wherein the first connection point is located along the first portion and the second connection point is located along the second portion.

3. The apparatus of claim 1, wherein the connection wiring has a conductive layer surrounding the hole.

4. The apparatus of claim 3, wherein the first connection point and the second connection point are located across the hole from each other.

5. The apparatus of claim 1, wherein a first impedance between the first and second connection points through the first portion and the fourth portion is substantially the same as a second impedance between the first and second connection points through the second portion and the third portion.

6. The apparatus of claim 5, wherein a first distance between the first and second connection points through the first portion and the fourth portion and a second distance between the first and second connection points through the second portion and the third portion.

7. An apparatus comprising:
    a first external terminal providing a connection external to the apparatus;
    a first circuit node;
    a first ring-shaped wiring directly connected to the first external terminal and the first circuit node at first and second connection points, respectively,
    wherein a first impedance between the first connection point and the second connection point is substantially constant regardless of a first distance between the first connection point and the second connection point;
    a second external terminal;
    a second circuit node; and
    a second ring-shaped wiring directly connected to the second external terminal and the second circuit node at third and fourth connection points, respectively,
    wherein the first impedance between the first and second connection points is substantially the same as a second impedance between the third and fourth connection points regardless of each of the first distance between the first and second connection points and a second distance between the third and fourth connection points.

8. The apparatus of claim 7, wherein the first ring-shaped wiring further comprises a first portion, a second portion, a third portion and a fourth portion, the third portion couples the first portion and the second portion at a first end of the first ring-shaped wiring, and the fourth portion couples the first portion and the second portion at a second end of the first ring-shaped wiring,
    wherein the first connection point is along the first portion and the second connection point is along the second portion, and
    wherein a distance between the first connection point and the second connection point of the first ring-shaped wiring is constant.

9. The apparatus of claim 8, wherein the first impedance between the first connection point and the second connection point of the first ring-shaped wiring is constant.

10. The apparatus of claim 7, further comprising an output buffer which includes a third circuit node coupled to the first circuit node.

11. The apparatus of claim 7, further comprising an output buffer which includes a third circuit node coupled to the first circuit node, and further comprising an input buffer including first and second input nodes, the first input node supplied with a reference voltage, the second input node coupled to the third circuit node.

12. The apparatus of claim 7, wherein the first ring-shaped wiring and the second ring-shaped wiring have substantially the same shape.

13. The apparatus of claim 7,
    wherein the first distance is different from the second distance between the third connection point and the fourth connection point.

14. An apparatus comprising;
    a first ring-shaped wiring connected directly to a first external terminal providing a connection external to the apparatus and a first circuit node at first and second connection points, respectively; and a second ring-shaped wiring coupled to a second external terminal providing a connection external to the apparatus and a second circuit node at third and fourth connection points, respectively, wherein a difference between a first impedance between the first and second connection points and a second impedance between the third and fourth connection points is substantially equal to, or less than, a quarter of a sheet resistance of a material of which the first and second ring-shaped wirings are made.

15. The apparatus of claim 14, wherein the first ring-shaped wiring and the second ring-shaped wiring have substantially the same shape.

16. The apparatus of claim 14, wherein a first distance around a portion of the first ring-shaped wiring between the first and second connection points and a second distance around a portion of the second ring-shaped wiring between the third and fourth connection points are substantially the same.

17. The apparatus of claim 16, wherein the first ring-shaped wiring and the second ring-shaped wiring have substantially the same shape.

18. The apparatus of claim 17, wherein the first ring-shaped wiring further comprises a first portion, a second portion, a third portion and a fourth portion, the third portion couples the first portion and the second portion at a first end of the first ring-shaped wiring, and the fourth portion couples the first portion and the second portion at a second end of the first ring-shaped wiring, wherein the first connection point is along the first portion and the second connection point is along the second portion, and wherein an impedance between the first connection point and the second connection point of the first ring-shaped wiring is constant.

19. The apparatus of claim 18, wherein a distance between the first connection point and the second connection point is constant.

\* \* \* \* \*